(12) United States Patent
Huang et al.

(10) Patent No.: US 7,917,878 B1
(45) Date of Patent: Mar. 29, 2011

(54) METHOD FOR PLACE AND ROUTE OF MULTICORE CHIP

(75) Inventors: Dajen Huang, Sunnyvale, CA (US); Yi Wu, Santa Clara, CA (US); Robert R. Brown, Fremont, CA (US)

(73) Assignee: Oracle America, Inc., Redwood City, CA (US)

( * ) Notice: Subject to any disclaimer, the term of this patent is extended or adjusted under 35 U.S.C. 154(b) by 509 days.

(21) Appl. No.: 12/022,950

(22) Filed: Jan. 30, 2008

(51) Int. Cl.
*G06F 17/50* (2006.01)
(52) U.S. Cl. ........ 716/119; 716/120; 716/123; 716/124; 716/125; 716/126
(58) Field of Classification Search ................ 716/7–12, 716/118–126
See application file for complete search history.

(56) References Cited

U.S. PATENT DOCUMENTS

2006/0031803 A1\* 2/2006 Eichenseer et al. ............. 716/10
\* cited by examiner

*Primary Examiner* — Paul Dinh
(74) *Attorney, Agent, or Firm* — Martine Penilla & Gencarella, LLP

(57) ABSTRACT

A number of virtual regionalization lines are laid out across a chip such that the virtual regionalization lines delineate a plurality of regions on the chip. One of the plurality of regions on the chip is designated as a master region and each of a remainder of the plurality of regions on the chip is designated as a duplicate region. A number of functional blocks are placed in the master region. Each of the functional blocks is replicated in each duplicate region by placing each functional block in each duplicate region so as to be symmetric with the corresponding functional block in the master region about the virtual regionalization lines. Wires are routed in the master region. The wires routed in the master region are replicated in each duplicate region so as to be symmetric about the virtual regionalization lines.

20 Claims, 6 Drawing Sheets

METHOD FOR PLACE AND ROUTE OF MULTICORE CHIP

BACKGROUND

Multicore chip integration, i.e., placing and routing, is generally performed using either a hierarchical approach or a flat approach. In the hierarchical approach, multiple cores and other functional logics are combined into one supercluster. Instances of this supercluster are then placed at the chip level. The supercluster tends to be large in dimension, thereby limiting chip floorplan options. Also, because the hierarchy associated with each supercluster instance must be traversed to make a design change at the chip level, it can become difficult to implement design changes or search for design solutions as required to satisfy chip performance specifications.

In the flat approach, all cores and functional logics are placed and routed at the chip level, thereby avoiding hierarchical chip integration boundaries. However, in the flat approach, the chip is considered as a whole during the place and route process. Therefore, the chip floorplan can vary widely from one location on the chip to another. Consequently, in the traditional flat approach, the entire chip may need to be considered as a whole in performing overall routing, timing, and design verification activities, thereby increasing the time and expense required to converge the chip to a final design. In view of the foregoing, an improved multicore chip place and route methodology is sought.

SUMMARY

In one embodiment, a method is disclosed for placing and routing a multicore chip. The method includes an operation for laying out a number of virtual regionalization lines across a chip such that the virtual regionalization lines delineate a plurality of regions on the chip. The method also includes an operation for designating one of the plurality of regions on the chip as a master region and each of a remainder of the plurality of regions on the chip as a duplicate region. The method further includes an operation for placing a number of recurring functional blocks in the master region, wherein each of the number of recurring functional blocks is to be present in each of the plurality of regions on the chip. Additionally, the method includes an operation for replicating the number of recurring functional blocks in each duplicate region by placing each recurring functional block in each duplicate region so as to be symmetric with the corresponding recurring functional block in the master region about the virtual regionalization lines.

In another embodiment, a multicore chip is disclosed. The multicore chip includes a plurality of regions of substantially equal size and shape delineated by a number of virtual regionalization lines. One of the plurality of regions is designated as a master region and each of a remainder of the plurality of regions is designated as a duplicate region. The multicore chip also includes a number of recurring functional blocks placed within the master region. The multicore chip further includes a copy of each recurring functional block within the master region placed in each of the duplicate regions so as to be symmetric with the corresponding recurring functional block in the master region about the virtual regionalization lines. Also, a number of wires are routed within the master region of the multicore chip. Furthermore, a copy of each wire routed within the master region is placed in each of the duplicate regions so as to be symmetric with the corresponding routed wire in the master region about the virtual regionalization lines.

In another embodiment, a computer readable storage medium including program instructions for placing and routing a multicore chip is disclosed. Program instructions are included for laying out a number of virtual regionalization lines across a chip such that the virtual regionalization lines delineate a plurality of regions on the chip. Program instructions are also included for designating one of the plurality of regions on the chip as a master region and each of a remainder of the plurality of regions on the chip as a duplicate region. Program instructions are further included for placing a number of recurring functional blocks in the master region, wherein each of the number of recurring functional blocks is to be present in each of the plurality of regions on the chip. Additionally, program instructions are included for automatically replicating the number of recurring functional blocks in each duplicate region by placing each recurring functional block in each duplicate region so as to be symmetric with the corresponding recurring functional block in the master region about the virtual regionalization lines.

Other aspects of the invention will become apparent from the following detailed description, taken in conjunction with the accompanying drawings, illustrating by way of example the principles of the invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
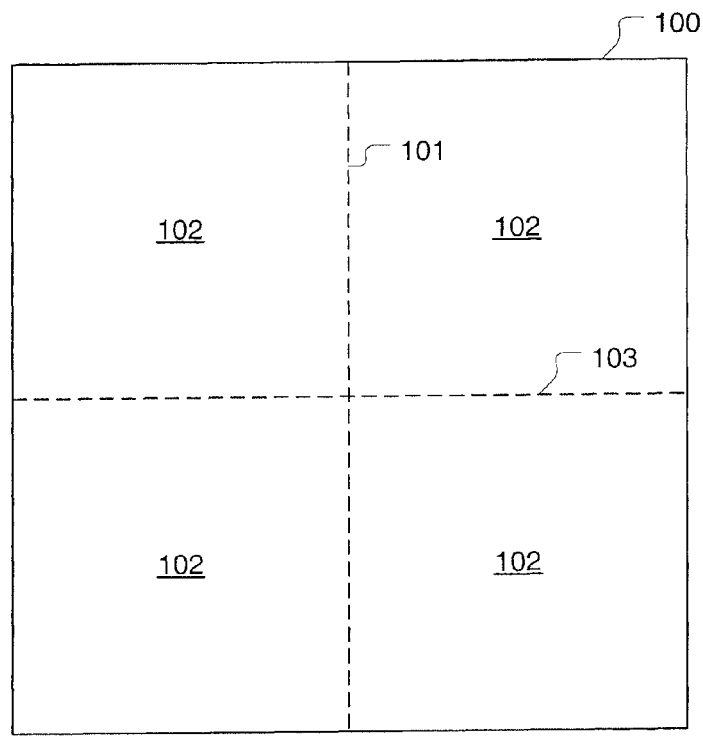
FIG. 1 is an illustration showing a chip, in accordance with one embodiment of the present invention.

FIG. 1 is an illustration showing a chip 100, in accordance with one embodiment of the present invention. In one embodiment, the chip 100 is to be defined as a multicore chip having multiple similarly defined core regions, wherein each core region includes a number of identical functional blocks, i.e., logic blocks. A number of virtual regionalization lines 101 and 103 are laid out across the chip 100, such that the virtual regionalization lines 101/103 delineate a number of regions 102 on the chip 100. In the exemplary embodiment of FIG. 1, the virtual regionalization lines 101/103 are laid out to delineate four regions 102. However, it should be understood that in other embodiments, virtual regionalization lines can be laid out in essentially any manner so as to delineate essentially any number of regions. In the embodiment where chip 100 represents a multicore chip, a separate core instance can be defined in each region 102 delineated by the virtual regionalization lines 101/103.

Figure 2:
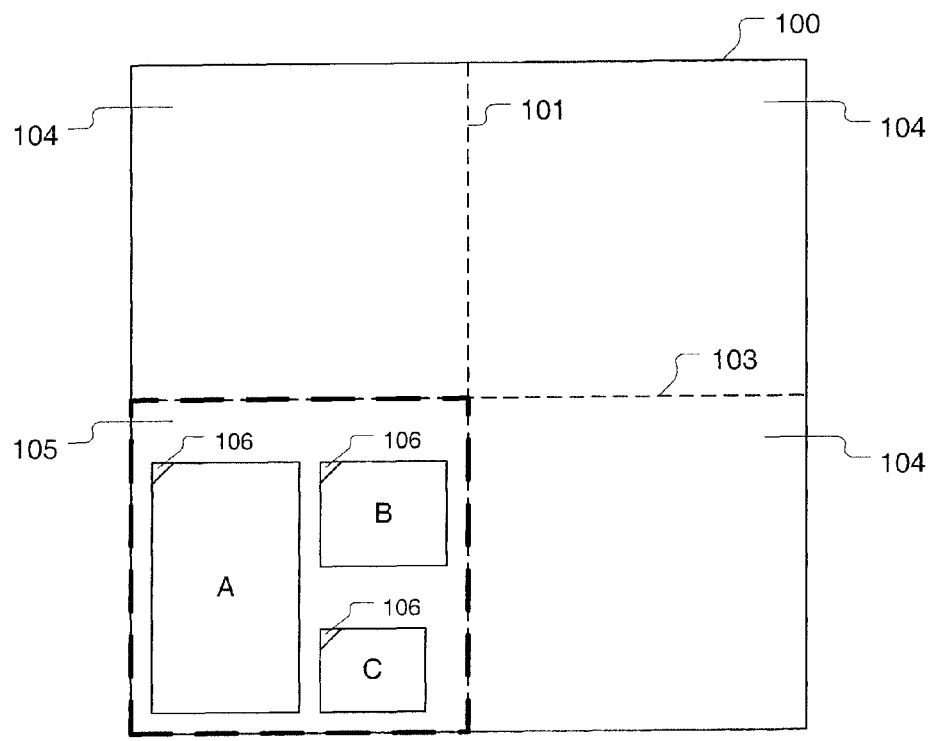
FIG. 2 is an illustration showing the chip having one of the regions designated as a master region, in accordance with one embodiment of the present invention.

FIG. 2 is an illustration showing the chip 100 having one of the regions 102 designated as a master region 105, in accordance with one embodiment of the present invention. Each of the regions 102 other than the master region 105 is designated as a duplicate region 104. In one embodiment, a set of recurring functional blocks are to be equally defined in the master region 105 and each of the duplicate regions 104. Each recurring functional block is explicitly placed in the master region 105, and is then copied from the master region 105 to each of the duplicate regions 104 so as to be symmetric with the corresponding recurring functional block in the master region 105 about the virtual regionalization lines 101/103. For example, FIG. 2 shows a number of recurring functional blocks A, B, and C explicitly placed in the master region 105. Each recurring functional block A, B, and C has a specific orientation with respect to the virtual regionalization lines 101/103, as designated by the corner marks 106.

Figure 3:
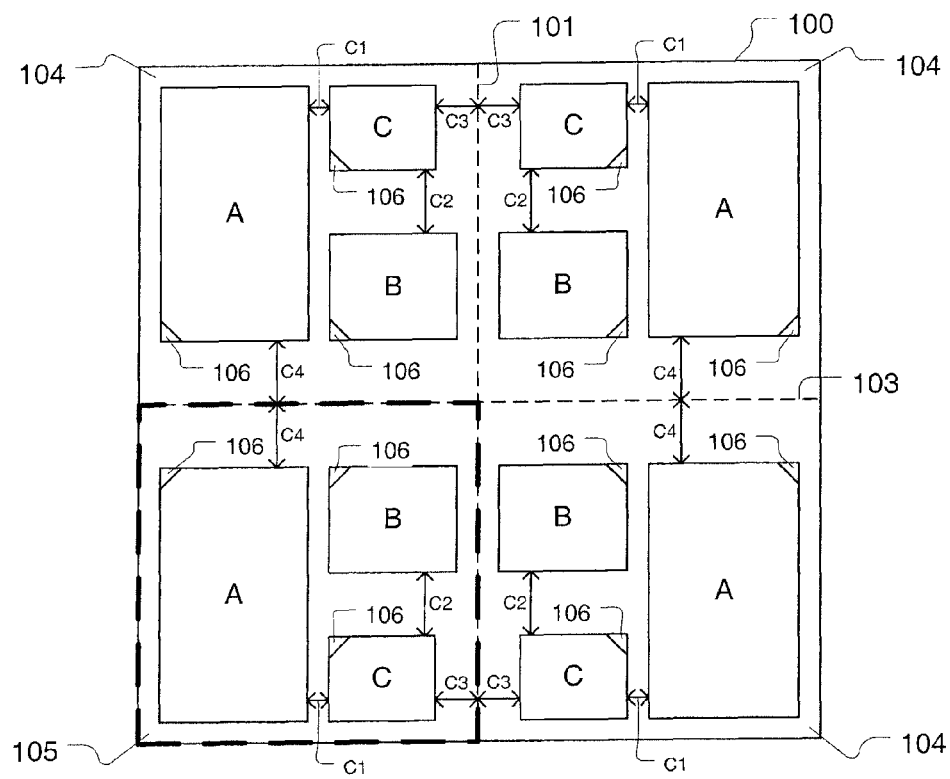
FIG. 3 is an illustration showing the recurring functional blocks, as explicitly defined in the master region, replicated each of the duplicate regions.

FIG. 3 is an illustration showing the recurring functional blocks A, B, and C, as explicitly defined in the master region 105, replicated each of the duplicate regions 104. More specifically, each of the recurring functional blocks A, B, and C is placed in each duplicate region 104 so as to be symmetric with the corresponding recurring functional block in the master region 105 about the virtual regionalization lines 101/103. It should be understood that the explicit placements of the recurring functional blocks A, B, and C within the master region 105 are used to automatically and symmetrically place the recurring functional blocks A, B, and C within each duplicate region 104. Therefore, the effort required to determined where to place each of the recurring functional blocks A, B, and C in the master region 105 does not have to be repeated for each of the duplicate regions 104.

As shown in FIG. 3, due to the symmetrical placement of the functional blocks A, B, and C in each region, channels C1 and C2 present between the functional blocks A, B, and C are also defined to be equal and symmetric about the virtual regionalization lines 101/103. Also, due to the symmetrical placement of the functional blocks A, B, and C in each region, channels C3 and C4 present between the functional blocks A, B, and C and the virtual regionalization lines 101/103 are defined to be equal and symmetric about the virtual regionalization lines 101/103. Therefore, the spacing of each channel C1, C2, C3, and C4 is defined to be the same in the master region 105 and each duplicate region 104.

Figure 4:
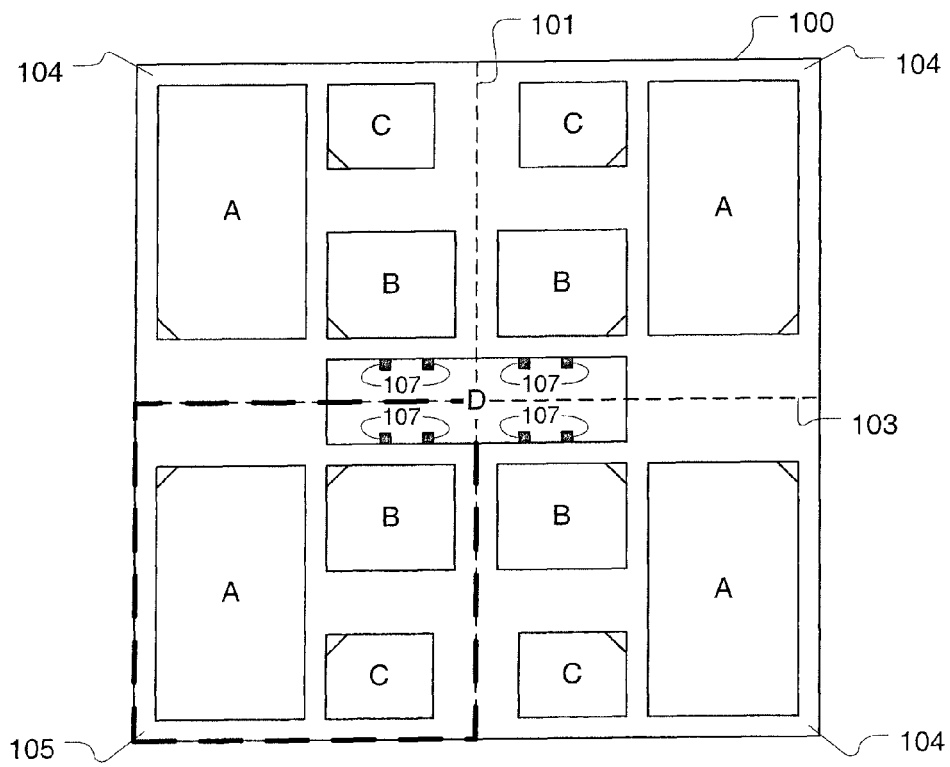
FIG. 4 is an illustration showing a shared functional block placed over the virtual regionalization lines such that the shared functional block is symmetrically placed within the regions (i.e., within the master region and the duplicate regions) about the virtual regionalization lines.

In addition to the recurring functional blocks (e.g., A, B, C), the chip 100 can also include a number of shared functional blocks, wherein each shared functional block is to be shared among a number of regions 102 of the chip 100, as delineated by the virtual regionalization lines 101/103. FIG. 4 is an illustration showing an exemplary shared functional block D placed over the virtual regionalization lines 101/103 such that the shared functional block D is symmetrically placed within the regions 102 (i.e., within the master region 105 and the duplicate regions 104) about the virtual regionalization lines 101/103. For example, in one embodiment, the shared functional block D is defined as a crossbar bus to enable communication of signals between the multiple cores respectively defined in the regions 102.

Additionally, a number of input/output pins 107 can be placed symmetrically in each of the regions 102 about the virtual regionalization lines 101/103. As with the recurring functional blocks A, B, and C, the input/output pins 107 can be explicitly defined in the master region 105, and replicated in each of the duplicate regions 104 so as to be symmetrically placed with respect to the input/output pins 107 in the master region 105 about the virtual regionalization lines 101/103. Therefore, the explicit placements of the input/output pins 107 within the master region 105 are used to automatically and symmetrically place the input/output pins 107 within each duplicate region 104. Thus, the effort required to determined where to place each of the input/output pins 107 in the master region 105 does not have to be repeated for each of the duplicate regions 104.

Figure 5:
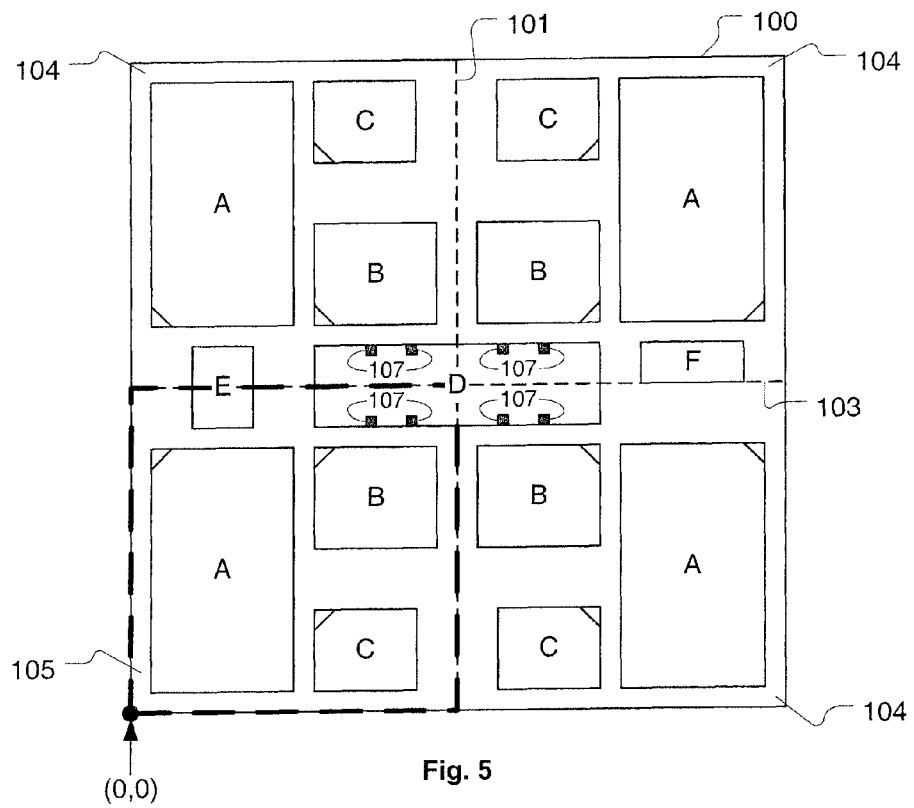
FIG. 5 is an illustration showing the exemplary chip with a number of region-independent functional blocks placed without regard to the virtual regionalization lines.

In addition to the recurring functional blocks (e.g., A, B, C) and the shared functional blocks (e.g., D), the chip 100 can also include a number of region-independent functional blocks that are placed without regard to the virtual regionalization lines 101/103 and the regions 102 delineated thereby. FIG. 5 is an illustration showing the exemplary chip 100 with a number of region-independent functional blocks E and F placed without regard to the virtual regionalization lines 101/103. In one embodiment, the region-independent functional blocks are placed on the chip 100 after placement of the recurring and shared functional blocks in the master region 105 and replication thereof in each duplicate region 104.

A grid of power tracks and a grid of wire tracks are defined across the chip such that the power and wire tracks in each duplicate region 104 are positioned symmetrically with respect to the power and wire tracks in the master region 105 about the virtual regionalization lines 101/103. In one embodiment, both the grid of power tracks and the grid of wire tracks are indexed to an origin of the chip, such as coordinate (0,0) as shown in FIG. 5. Therefore, the grid of power tracks and the grid of wire tracks are defined on a chip-wide basis, but are also defined to be symmetric between the master region 105 and each of the duplicate regions 104.

Figure 6:
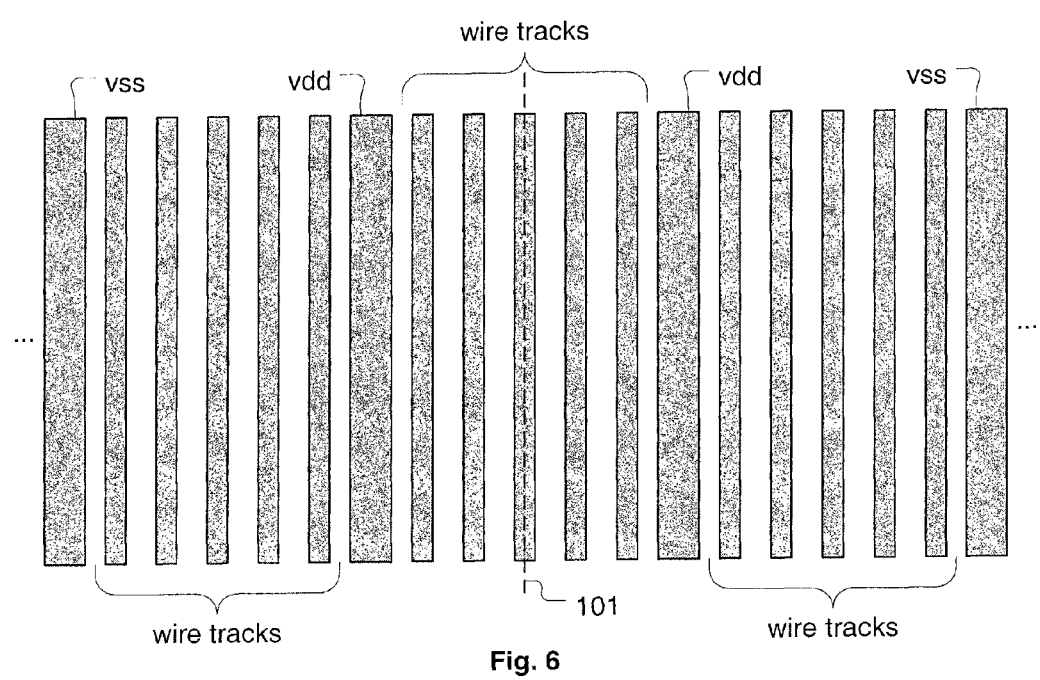
FIG. 6 is an illustration showing an example of vertically oriented components of the power track grid and wire track grid, in accordance with one embodiment of the present invention.

FIG. 6 is an illustration showing an example of vertically oriented components of the power track grid and wire track grid, in accordance with one embodiment of the present invention. The vertically oriented power tracks vdd/vss are symmetric about the virtual regionalization line 101. Also, it should be appreciated that each of the vertically oriented power tracks is designated as either power (vdd) or ground (vss) in an alternating manner across each region 102, so as to be symmetric about the virtual regionalization line 101. In one embodiment, the vertically oriented wire tracks are defined such that a same number of vertically oriented wire tracks are present between each pair of adjacent vertical power tracks. However, it should be appreciated that in other embodiments, the same number of vertically oriented wire tracks is not required between each pair of adjacent vertical power tracks, so long as the vertically oriented wire tracks in each duplicate region 104 are symmetric with the vertically oriented wire tracks in the master region 105 about the virtual regionalization lines.

Figure 7:
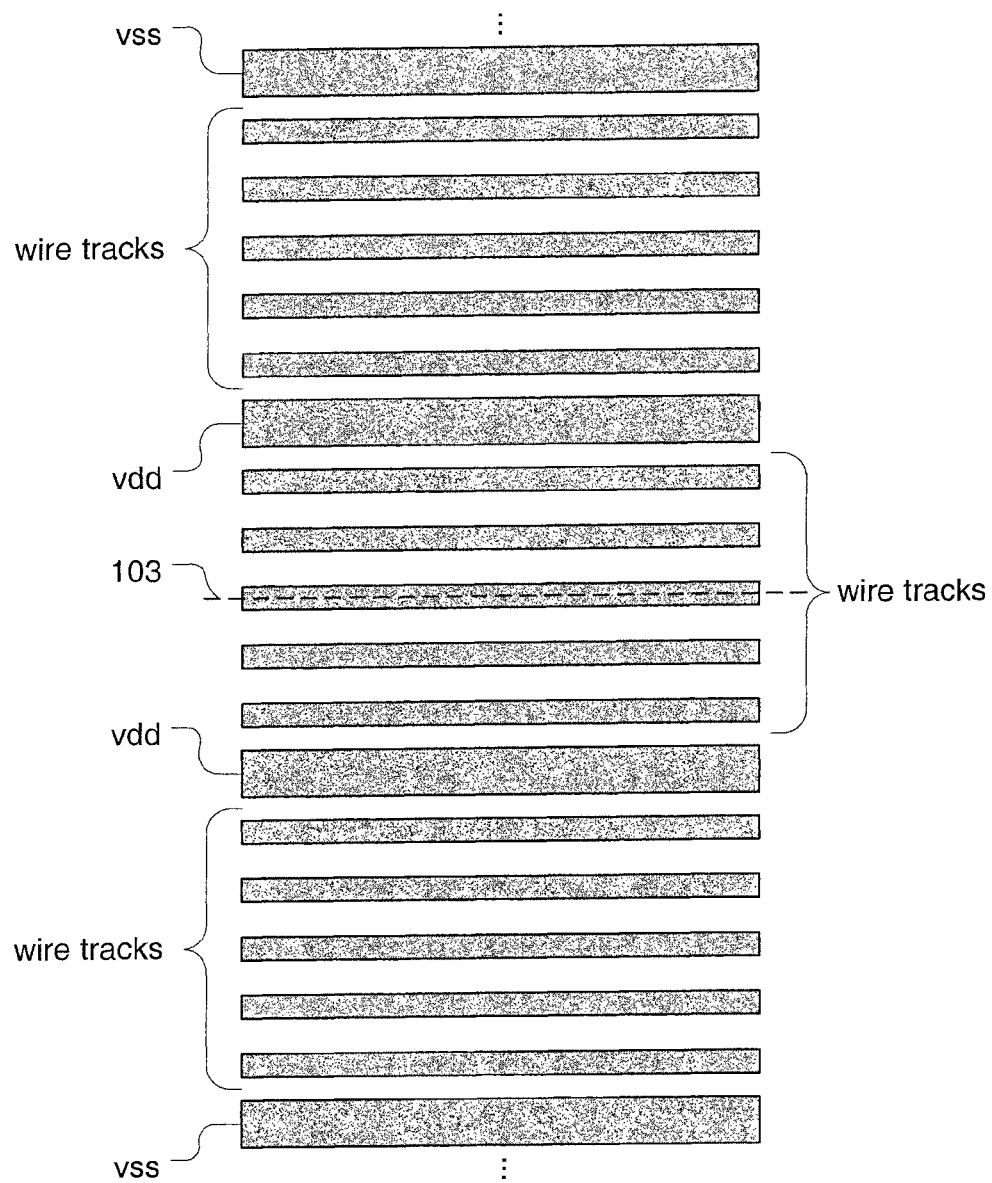
FIG. 7 is an illustration showing an example of horizontally oriented components of the power track grid and wire track grid, in accordance with one embodiment of the present invention.

FIG. 7 is an illustration showing an example of horizontally oriented components of the power track grid and wire track grid, in accordance with one embodiment of the present invention. The horizontally oriented power tracks vdd/vss are symmetric about the virtual regionalization line 103. Also, it should be appreciated that each of the horizontally oriented power tracks is designated as either power (vdd) or ground (vss) in an alternating manner across each region 102, so as to be symmetric about the virtual regionalization line 103. In one embodiment, the horizontally oriented wire tracks are defined such that a same number of horizontally oriented wire tracks are present between each pair of adjacent horizontal power tracks. However, it should be appreciated that n other embodiments, the same number of horizontally oriented wire tracks is not required between each pair of adjacent horizontal power tracks, so long as the horizontally oriented wire tracks in each duplicate region 104 are symmetric with the horizontally oriented wire tracks in the master region 105 about the virtual regionalization lines.

Figure 8:
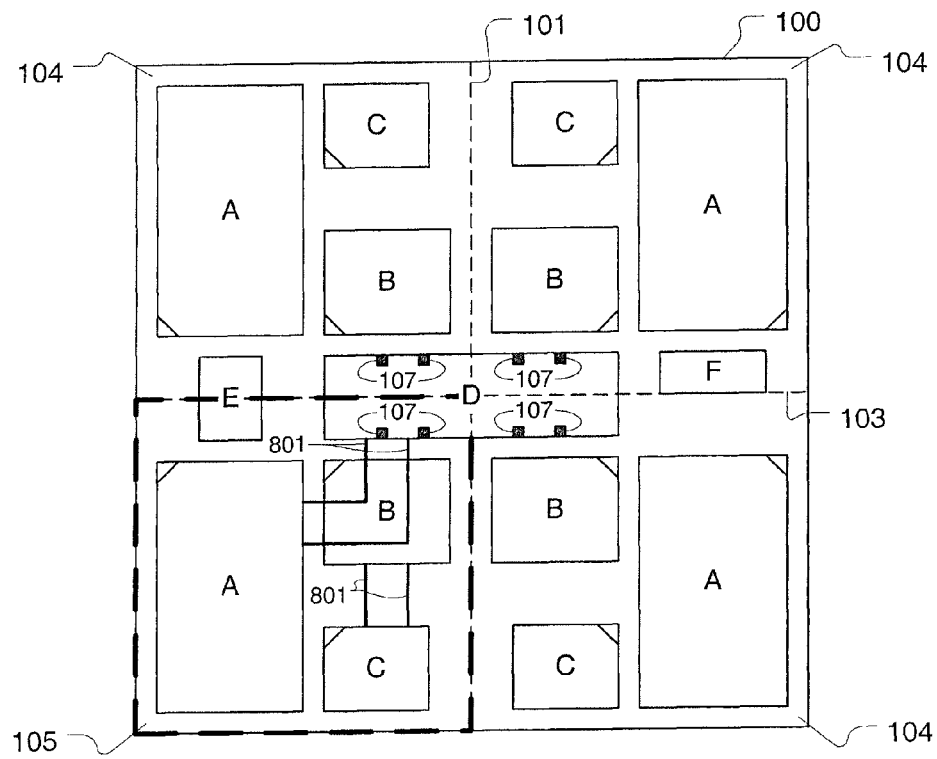
FIG. 8 is an illustration showing a number of wires routed in the master region, in accordance with one embodiment of the present invention.
Figure 9:
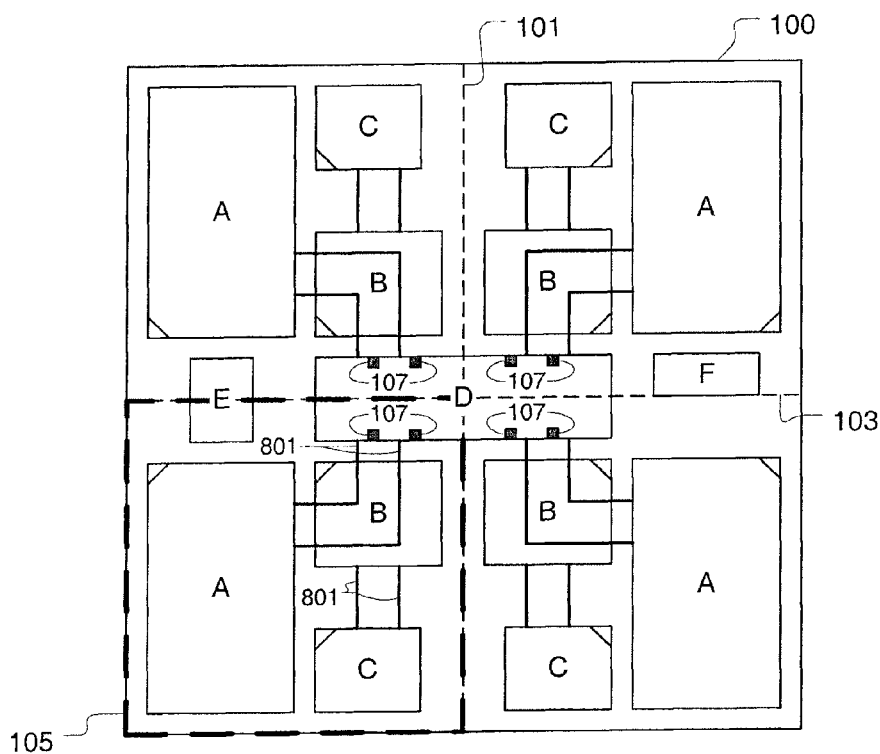
FIG. 9 is an illustration showing a replication of the wires in the master region in each duplicate region, in accordance with one embodiment of the present invention.

Once the power track grid and wire track grid are defined across the chip 100, wires are explicitly routed in the master region 105 according to the power track grid and wire track grid as defined within the master region 105. Then, the wires routed in the master region 105 are replicated in each duplicate region 104 by copying each wire routed in the master region 105 to each duplicate region 104 so as to be symmetric about the virtual regionalization lines. FIG. 8 is an illustration showing a number of wires 801 routed in the master region 105, in accordance with one embodiment of the present invention. FIG. 9 is an illustration showing a replication of the wires 801 in the master region 105 in each duplicate region 104, in accordance with one embodiment of the present invention. Each wire 801 having been explicitly routed in the master region 105 is automatically copied to each duplicate region 104 so as to be symmetric about the virtual regionalization lines 101/103. Therefore, the effort required to explicitly place each of the wires 801 in the master region 105 does not have to be repeated for each of the duplicate regions 104. Also, due to the fully symmetric chip floorplan, pin locations, power grids, and wire tracks, the wires copied from the master region to the duplicate regions will hookup correctly in each duplicate region and have correct connectivity.

Based on the foregoing, it should be appreciated that integration of the chip 100, i.e., placing and routing of each region 102 of the chip 100, is substantially accomplished by placing and routing the master region 105. Therefore, use of the virtual regionalization lines 101/103 and enforcement of symmetry about the virtual regionalization lines 101/103, with regard to functional block placement and wire routing, provides for integration of essentially the entire chip 100 on a flat basis by simply placing and routing the master region 105. It should be appreciated that a content of the master region 105 and each duplicate region 104 is viewable and accessible in its entirety without having to traverse through a chip integration hierarchy.

Moreover, the virtual regionalization and symmetry enforcement, as described herein, allows the design verification effort to be primarily focused on the master region 105. For example, analyses such as maxtime, mintime, noise, EM/IR, etc., can be performed on the master region 105, and circuitry modification solutions can be perfected in the master region 105 so as to comply with design specifications. Then, the circuitry modification solutions as perfected in the master region 105 can be replicated in the duplicate regions 104, without having to perform the entire design verification process on the duplicate regions 104. Therefore, it should be appreciated that substantial savings in design verification effort and expense can be realized by replicating the master region 105 circuitry modification solutions as required to pass the design verification in each of the duplicate regions 104.

Figure 10:
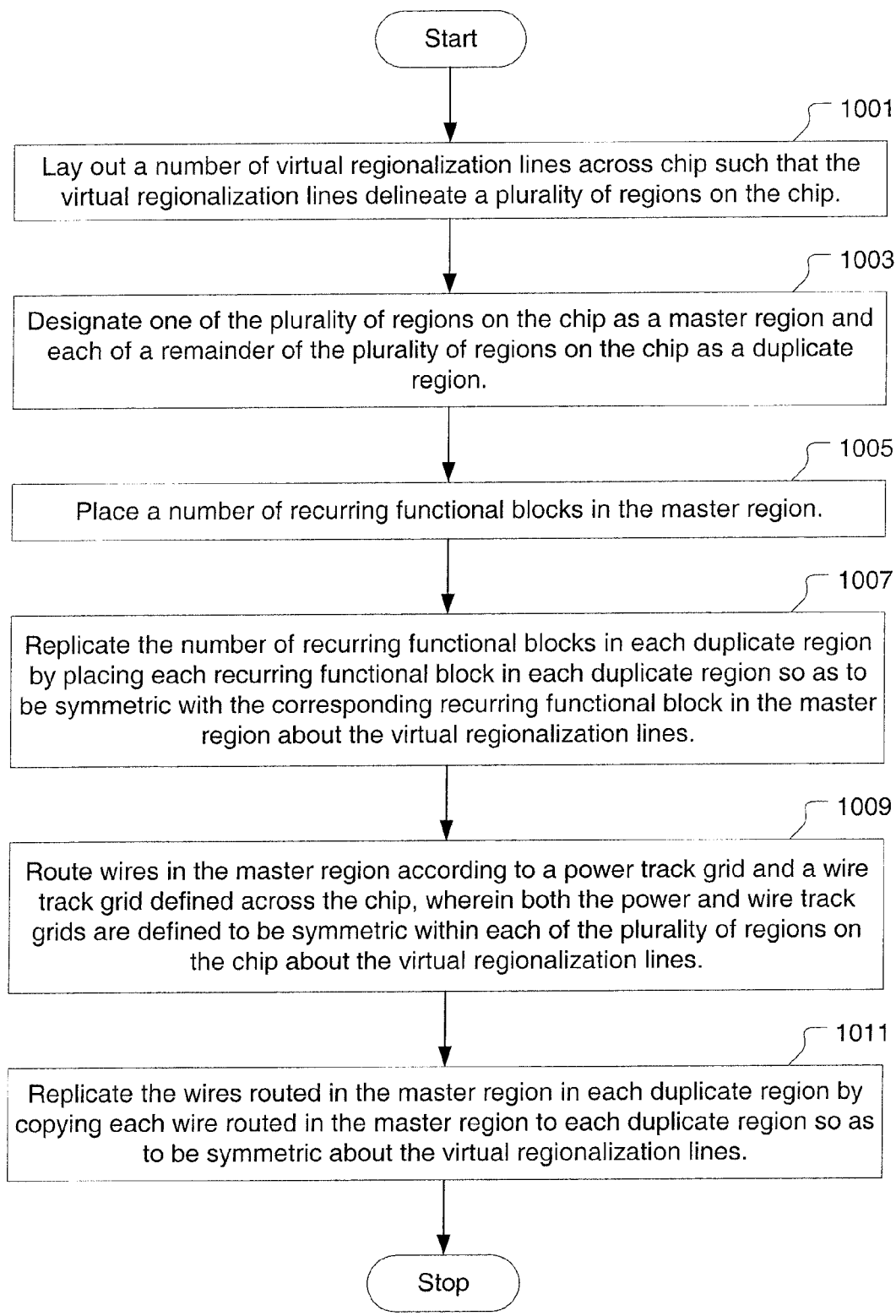
FIG. 10 is an illustration showing a flowchart of a method for placing and routing a multicore chip, in accordance with one embodiment of the present invention.

FIG. 10 is an illustration showing a flowchart of a method for placing and routing a multicore chip, in accordance with one embodiment of the present invention. The method includes an operation 1001 for laying out a number of virtual regionalization lines across a chip such that the virtual regionalization lines delineate a plurality of regions on the chip. The method also includes an operation 1003 for designating one of the plurality of regions on the chip as a master region and each of a remainder of the plurality of regions on the chip as a duplicate region. It should be understood that the master region and each duplicate region is viewable and accessible in its entirety without having to traverse through a chip integration hierarchy.

The method further includes an operation 1005 for placing a number of recurring functional blocks in the master region, wherein each of the number of recurring functional blocks is to be present in each of the plurality of regions on the chip. The method also includes an operation 1007 for replicating the number of recurring functional blocks in each duplicate region by placing each recurring functional block in each duplicate region so as to be symmetric with the corresponding recurring functional block in the master region about the virtual regionalization lines.

In one embodiment, the method of FIG. 10 further includes an operation for placing a number of shared functional blocks over one or more virtual regionalization lines such that each shared functional block is symmetrically placed within regions on the chip about the one or more virtual regionalization lines. Also, in one embodiment, the method of FIG. 10 includes operations for placing a number of input/output pins in the master region and replicating the number of input/output pins in each duplicate region. The input/output pins are replicated by placing each input/output pin in each duplicate region so as to be symmetric with the corresponding input/output pin in the master region about the virtual regionalization lines. Further, in one embodiment, the method of FIG. 10 includes an operation for placing a number of region-independent functional blocks on the chip, wherein each region-independent functional block is placed without regard to the virtual regionalization lines. Additionally, in one embodiment, the shared functional blocks, the input/output pins, and the region-independent functional blocks are placed on the chip prior to routing wires on the chip.

The method of FIG. 10 further includes an operation 1009 for routing wires in the master region according to a power track grid and a wire track grid defined across the chip. The method also includes an operation 1011 for replicating the wires routed in the master region in each duplicate region by copying each wire routed in the master region to each duplicate region so as to be symmetric about the virtual regionalization lines. The power track grid is defined across the chip so as to include a number of horizontal and vertical power tracks extending across the chip and symmetrically positioned within each of the plurality of regions on the chip about the virtual regionalization lines. The wire track grid is defined across the chip so as to include a number of horizontal and vertical wire tracks extending across the chip and symmetrically positioned within each of the plurality of regions on the chip about the virtual regionalization lines.

In one embodiment, a same number of horizontal wire tracks are defined between each pair of adjacent horizontal power tracks across the chip, and a same number of vertical wire tracks are defined between each pair of adjacent vertical power tracks across the chip. Also, in one embodiment, each of the number of horizontal power tracks is designated as either power or ground in an alternating manner across each region so as to be symmetrically designated about the virtual regionalization lines. Similarly, in one embodiment, each of the number of vertical power tracks is designated as either power or ground in an alternating manner across each region so as to be symmetrically designated about the virtual regionalization lines.

Additionally, in one embodiment, the method of FIG. 10 further includes operations for performing a design verification on the master region, and modifying either the placed functional blocks, the routed wires, or the combination thereof in the master region so as to pass the design verification. Then, in another operation, the modifications in the master region are replicated in each duplicate region such that each duplicate region is symmetric with the master region about the virtual regionalization lines.

The method for placing and routing a multicore chip, as described herein, utilizes virtual regionalization of the chip and enforcement of placement and routing symmetry within the virtual regions to provide design flexibility in chip floorplan and optimization while reducing the amount of design work required for design closure. The place and route method described herein benefits from the flexibility and accessibility afforded by integrating the chip in a non-hierarchical manner. However, the place and route method described herein also benefits from the efficiencies and reduced complexity afforded by symmetric replication of placement and routing from a master region of the chip to other duplicate regions of the chip, without having to explicitly place and route the duplicate regions of the chip. In one embodiment the master region and each duplicate region respectively define a core of the multicore chip.

In one embodiment, a special Verilog naming convention is utilized to enable replication of placed functional blocks and routed wires from the master region of the chip to other duplicate regions of the chip. For example, consider a core block in the master region as being designated core1, and a corresponding core block in a duplicate region as being designated core4. A net extending from core1 to an IO frame IO3 in the master region is assigned a Verilog name core1_IO3_data[0]. The corresponding net extending from core4 to an IO frame IO3 in the duplicate region is assigned a Verilog name core4_IO3_data[0]. Therefore, it should be appreciated that the name of a particular net associated with each routing within each region is defined to identify the particular net and region within which the particular net resides.

Embodiments of the present invention may be practiced with various computer system configurations including hand-held devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the present invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. Embodiments of the present invention can be processed on a single computer, or using multiple computers or computer components which are interconnected. A computer, as used herein, shall include a standalone computer system having its own processor, its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

The invention can also be embodied as computer readable code on a computer readable storage medium. The computer readable storage medium is any data storage device that can store data which can be thereafter be read by a computer system. Examples of the computer readable storage medium include hard drives, network attached storage (NAS), read-only memory, random-access memory, CD-ROMs, CD-Rs, CD-RWs, magnetic tapes, and other optical and non-optical data storage devices. The computer readable storage medium can also be accessed over a network of coupled computer systems so that the computer readable code is executed in a distributed manner.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer implemented method for placing and routing a multicore chip, comprising:
    laying out a number of virtual regionalization lines across a chip such that the virtual regionalization lines delineate a plurality of regions on the chip;
    designating one of the plurality of regions on the chip as a master region and each of a remainder of the plurality of regions on the chip as a duplicate region;
    placing a number of recurring functional blocks in the master region, wherein each of the number of recurring functional blocks is to be present in each of the plurality of regions on the chip;
    operating a computer to replicate the number of recurring functional blocks in each duplicate region by placing each recurring functional block in each duplicate region so as to be symmetric with the corresponding recurring functional block in the master region about the virtual regionalization lines;
    defining a number of horizontal power tracks across the chip such that the horizontal power tracks are symmetrically positioned within each of the plurality of regions on the chip about the virtual regionalization lines; and
    defining a number of vertical power tracks across the chip such that the vertical power tracks are symmetrically positioned within each of the plurality of regions on the chip about the virtual regionalization lines.

2. A computer implemented method for placing and routing a multicore chip as recited in claim 1, further comprising:
    defining a number of horizontal wire tracks across the chip such that the horizontal wire tracks are symmetrically positioned within each of the plurality of regions on the chip about the virtual regionalization lines; and defining a number of vertical wire tracks across the chip such that the vertical wire tracks are symmetrically positioned within each of the plurality of regions on the chip about the virtual regionalization lines.

3. A computer implemented method for placing and routing a multicore chip as recited in claim 2, wherein a same number of horizontal wire tracks are defined between each pair of adjacent horizontal power tracks across the chip, and wherein a same number of vertical wire tracks are defined between each pair of adjacent vertical power tracks across the chip.

4. A computer implemented method for placing and routing a multicore chip as recited in claim 2, wherein each of the number of horizontal power tracks is designated as either power or ground in an alternating manner across each region so as to be symmetrically designated about the virtual regionalization lines, and wherein each of the number of vertical power tracks is designated as either power or ground in an alternating manner across each region so as to be symmetrically designated about the virtual regionalization lines.

5. A computer implemented method for placing and routing a multicore chip as recited in claim 2, further comprising:
routing wires in the master region according to the horizontal and vertical power tracks defined in the master region and according to the horizontal and vertical wire tracks defined in the master region; and
replicating the wires routed in the master region in each duplicate region by copying each wire routed in the master region to each duplicate region so as to be symmetric about the virtual regionalization lines.

6. A computer implemented method for placing and routing a multicore chip as recited in claim 5, further comprising:
placing a shared functional block over one or more virtual regionalization lines such that the shared functional block is symmetrically placed within regions on the chip about the one or more virtual regionalization lines, wherein the shared functional block is placed prior to routing wires in the master region.

7. A computer implemented method for placing and routing a multicore chip as recited in claim 5, further comprising:
placing a number of input/output pins in the master region prior to routing wires in the master region; and
replicating the number of input/output pins in each duplicate region by placing each input/output pin in each duplicate region so as to be symmetric with the corresponding input/output pin in the master region about the virtual regionalization lines.

8. A computer implemented method for placing and routing a multicore chip as recited in claim 5, further comprising:
placing a number of region-independent functional blocks on the chip prior to routing wires in the master region, wherein each region-independent functional block is placed without regard to the virtual regionalization lines.

9. A computer implemented method for placing and routing a multicore chip as recited in claim 5, further comprising:
performing a design verification on the master region;
modifying either the placed functional blocks, the routed wires, or the combination thereof in the master region to pass the design verification; and
replicating the modifications in the master region in each duplicate region such that each duplicate region is symmetric with the master region about the virtual regionalization lines.

10. A computer implemented method for placing and routing a multicore chip as recited in claim 5, wherein a content of the master region and each duplicate region is viewable and accessible in its entirety without having to traverse through a chip integration hierarchy.

11. A multicore chip, comprising:
a plurality of regions of substantially equal size and shape delineated by a number of virtual regionalization lines, wherein one of the plurality of regions is designated as a master region and each of a remainder of the plurality of regions is designated as a duplicate region;
a number of recurring functional blocks placed within the master region;
a copy of each recurring functional block within the master region placed in each of the duplicate regions so as to be symmetric with the corresponding recurring functional block in the master region about the virtual regionalization lines;
a number of wires routed within the master region; and
a copy of each wire routed within the master region placed in each of the duplicate regions so as to be symmetric with the corresponding routed wire in the master region about the virtual regionalization lines.

12. A multicore chip as recited in claim 11, wherein each wire routed in the master region and each duplicate region is defined along either a grid of power tracks or a grid of wire tracks, wherein both the grid of power tracks and the grid of wire tracks are symmetrically positioned within each of the plurality of regions about the virtual regionalization lines.

13. A multicore chip as recited in claim 12, wherein the grid of power tracks is defined by a number of horizontal and vertical power tracks defined across the chip so as to be symmetrically positioned within each of the plurality of regions about the virtual regionalization lines, and
wherein the grid of wire tracks is defined by a number of horizontal and vertical wire tracks defined across the chip so as to be symmetrically positioned within each of the plurality of regions about the virtual regionalization lines.

14. A multicore chip as recited in claim 13, wherein a same number of horizontal wire tracks are defined between each pair of adjacent horizontal power tracks across the chip, and wherein a same number of vertical wire tracks are defined between each adjacent pair of vertical power tracks across the chip.

15. A multicore chip as recited in claim 11, further comprising:
a shared functional block placed over one or more virtual regionalization lines such that the shared functional block is symmetrically placed within regions about the one or more virtual regionalization lines; and
a number of input/output pins placed symmetrically in each of the plurality of regions about the virtual regionalization lines.

16. A data storage device for storing data to be read by a computer system including program instructions for placing and routing a multicore chip, comprising:
program instructions for laying out a number of virtual regionalization lines across a chip such that the virtual regionalization lines delineate a plurality of regions on the chip;
program instructions for designating one of the plurality of regions on the chip as a master region and each of a remainder of the plurality of regions on the chip as a duplicate region;
program instructions for placing a number of recurring functional blocks in the master region, wherein each of the number of recurring functional blocks is to be present in each of the plurality of regions on the chip; and program instructions for automatically replicating the number of recurring functional blocks in each duplicate region by placing each recurring functional block in each duplicate region so as to be symmetric with the corresponding recurring functional block in the master region about the virtual regionalization lines; and program instructions for defining a grid of power tracks and a grid of wire tracks across the chip such that both the grid of power tracks and the grid of wire tracks are symmetrically positioned within each of the plurality of regions on the chip about the virtual regionalization lines.

17. A data storage device for storing data to be read by a computer system including program instructions for placing and routing a multicore chip as recited in claim 16, further comprising:

program instructions for placing a shared functional block over one or more virtual regionalization lines such that the shared functional block is symmetrically placed within regions about the one or more virtual regionalization lines.

18. A data storage device for storing data to be read by a computer system including program instructions for placing and routing a multicore chip as recited in claim 16, further comprising:

program instructions for routing a number of wires in the master region according to the grid of power tracks and grid of wire tracks; and program instructions for replicating each wire routed within the master region in each of the duplicate regions so as to be symmetric with the corresponding wire routed in the master region about the virtual regionalization lines.

19. A data storage device for storing data to be read by a computer system including program instructions for placing and routing a multicore chip as recited in claim 18, further comprising:

program instructions for performing a design verification on the master region;

program instructions for modifying the placed functional blocks, the routed wires, or the combination thereof in the master region to pass the design verification; and program instructions for automatically replicating the modifications in the master region in each duplicate region such that each duplicate region is symmetric with the master region about the virtual regionalization lines.

20. A data storage device for storing data to be read by a computer system including program instructions for placing and routing a multicore chip as recited in claim 16, further comprising:

program instructions for viewing and accessing a content of the master region and each duplicate region without having to traverse through a chip integration hierarchy.

* * * * *